United States Patent
Kikuchi et al.

(10) Patent No.: US 10,924,082 B2
(45) Date of Patent: Feb. 16, 2021

(54) ACOUSTIC WAVE DEVICE AND MANUFACTURING METHOD FOR SAME

(71) Applicant: Murata Manufacturing Co., Ltd., Nagaokakyo (JP)

(72) Inventors: Taku Kikuchi, Nagaokakyo (JP); Chihiro Konoma, Nagaokakyo (JP); Masashi Tsubokawa, Nagaokakyo (JP); Ryo Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 624 days.

(21) Appl. No.: 15/832,851

(22) Filed: Dec. 6, 2017

(65) Prior Publication Data
US 2018/0097501 A1 Apr. 5, 2018

Related U.S. Application Data

(63) Continuation of application No. PCT/JP2016/066248, filed on Jun. 1, 2016.

(30) Foreign Application Priority Data

Jul. 17, 2015 (JP) .................. 2015-142768

(51) Int. Cl.
*H03H 9/13* (2006.01)
*H03H 3/08* (2006.01)
(Continued)

(52) U.S. Cl.
CPC ......... *H03H 9/131* (2013.01); *H01L 41/1873* (2013.01); *H01L 41/297* (2013.01);
(Continued)

(58) Field of Classification Search
CPC .... H03H 9/131; H03H 9/132; H03H 9/14541; H03H 9/19; H03H 9/02535; H03H 9/02637; H03H 9/02677
(Continued)

(56) References Cited

U.S. PATENT DOCUMENTS

| 2004/0070313 A1 | 4/2004 | Furukawa et al. |
| 2006/0076851 A1* | 4/2006 | Fujimoto ................. H03H 3/08 |
| | | 310/313 R |

(Continued)

FOREIGN PATENT DOCUMENTS

| JP | 05-22067 A | 1/1993 |
| JP | 2001-217672 A | 8/2001 |

(Continued)

OTHER PUBLICATIONS

Official Communication issued in International Patent Application No. PCT/JP2016/066248, dated Aug. 23, 2016.

*Primary Examiner* — Derek J Rosenau
(74) *Attorney, Agent, or Firm* — Keating & Bennett, LLP

(57) ABSTRACT

An acoustic wave device includes a piezoelectric substrate including an electrode formation surface, and an IDT electrode provided on the electrode formation surface. The IDT electrode includes a close contact layer located on the electrode formation surface, and a main electrode layer located on the close contact layer. The close contact layer includes first and second layers that respectively include first and second lateral surfaces. An area of a surface of the second layer that is in close contact with the main electrode layer is smaller than an area of a surface of the first layer that is in close contact with the piezoelectric substrate. An inclination angle of the second lateral surface is smaller than an inclination angle of the first lateral surface.

15 Claims, 6 Drawing Sheets

(51) Int. Cl.
  *H03H 9/145* (2006.01)
  *H01L 41/187* (2006.01)
  *H01L 41/297* (2013.01)
  *H03H 3/02* (2006.01)
  *H03H 9/19* (2006.01)

(52) U.S. Cl.
  CPC ............... *H03H 3/02* (2013.01); *H03H 3/08* (2013.01); *H03H 9/132* (2013.01); *H03H 9/14541* (2013.01); *H03H 9/19* (2013.01)

(58) Field of Classification Search
  USPC ...... 310/313 R, 313 A, 313 B, 313 C, 313 D
  See application file for complete search history.

(56) References Cited

U.S. PATENT DOCUMENTS

| | | | |
|---|---|---|---|
| 2009/0121584 A1* | 5/2009 | Nishimura | H03H 9/14541 310/313 B |
| 2014/0232239 A1 | 8/2014 | Iwasaki et al. | |
| 2019/0334500 A1* | 10/2019 | Horikawa | H03H 9/02881 |

FOREIGN PATENT DOCUMENTS

| | | |
|---|---|---|
| JP | 2014-158138 A | 8/2014 |
| WO | 03/058813 A1 | 7/2003 |
| WO | 2007-034832 A1 | 3/2007 |

* cited by examiner

ACOUSTIC WAVE DEVICE AND MANUFACTURING METHOD FOR SAME

CROSS REFERENCE TO RELATED APPLICATIONS

This application claims the benefit of priority to Japanese Patent Application No. 2015-142768 filed on Jul. 17, 2015 and is a Continuation Application of PCT Application No. PCT/JP2016/066248 filed on Jun. 1, 2016. The entire contents of each application are hereby incorporated herein by reference.

BACKGROUND OF THE INVENTION

1. Field of the Invention

The present invention relates to an acoustic wave device and a manufacturing method for the acoustic wave device.

2. Description of the Related Art

Acoustic wave devices have been widely included in cellular phones and on the like. For instance, the following Japanese Unexamined Patent Application Publication No. 2001-217672 discloses an example of an acoustic wave device including an IDT (interdigital transducer) electrode. The disclosed acoustic wave device includes a piezoelectric substrate, an intermediate layer located on the piezoelectric substrate, and an electrode film located on the intermediate layer.

When the acoustic wave device of the type disclosed in Japanese Unexamined Patent Application Publication No. 2001-217672 is manufactured by a lift-off process, a metal film for the intermediate layer and a metal film for the electrode film are vapor-deposited on the piezoelectric substrate and on a resist pattern. A metal with a high melting point is included as the metal for the intermediate layer. Therefore, it sometimes happens that, during a step of forming the intermediate layer, the resist pattern is greatly deformed due to radiation heat from a vapor-deposition source and heat conduction from vapor deposition particles. With such a deformation, a lateral surface of the intermediate layer is greatly inclined in some cases. This may lead to a possibility that a distortion of the electrode film due to excitation of the IDT electrode increases, and that IMD (intermodulation distortion) characteristics degrade.

SUMMARY OF THE INVENTION

Preferred embodiments of the present invention provide acoustic wave devices in which a distortion of an IDT electrode due to excitation of an acoustic wave is able to be significantly reduced or prevented regardless of the melting point of the metal included as the intermediate layer described above, and in which the IMD characteristics are able to be significantly improved, and provide manufacturing methods of the acoustic wave devices.

According to a preferred embodiment of the present invention, an acoustic wave device includes a piezoelectric substrate including an electrode formation surface, and an IDT electrode provided on the electrode formation surface of the piezoelectric substrate, wherein the IDT electrode includes a close contact layer located on the electrode formation surface of the piezoelectric substrate, and a main electrode layer located on the close contact layer, wherein the close contact layer includes a first layer in close contact with the piezoelectric substrate, and a second layer in close contact with the main electrode layer, wherein the first layer includes a first lateral surface, and the second layer includes a second lateral surface, wherein at least portions of each of the first and second lateral surfaces are inclined relative to a normal direction of the electrode formation surface, and an area of a surface of the second layer that is in close contact with the main electrode layer is smaller than an area of a surface of the first layer that is in close contact with the piezoelectric substrate, and wherein angles defined by the inclined portions of each of the first and second lateral surfaces with respect to the normal direction of the electrode formation, respectively, are inclination angles of each of the first and second lateral surfaces and the inclination angle of the second lateral surface is smaller than the inclination angle of the first lateral surface.

According to a preferred embodiment of the present invention, in the above acoustic wave device, the main electrode layer includes a lateral surface, and an angle defined by the lateral surface of the main electrode layer with respect to the normal direction of the electrode formation surface of the piezoelectric substrate is an inclination angle of the lateral surface of the main electrode layer, and the inclination angle of the lateral surface of the main electrode layer is equal to or smaller than the inclination angle of the second lateral surface. As a result, a distortion of the main electrode layer due to excitation of an acoustic wave is able to be further significantly reduced or prevented.

According to a preferred embodiment of the present invention, in the above acoustic wave device, an elastic modulus of a metal of the close contact layer is larger than an elastic modulus of a metal of the main electrode layer. Thus, the distortion of the main electrode layer due to the excitation of the acoustic wave is able to be significantly reduced or prevented.

According to a preferred embodiment of the present invention, in the above acoustic wave device, a melting point of a metal of the close contact layer is equal to or higher than a melting point of a metal of the main electrode layer. Accordingly, the distortion of the main electrode layer due to the excitation of the acoustic wave is able to be significantly reduced or prevented more reliably.

According to a preferred embodiment of the present invention, in the above acoustic wave device, the close contact layer includes Ti, and the main electrode layer includes Al. Consequently, the distortion of the main electrode layer due to the excitation of the acoustic wave is able to be further significantly reduced or prevented.

According to a preferred embodiment of the present invention, an acoustic wave device includes a piezoelectric substrate including an electrode formation surface, and an IDT electrode provided on the electrode formation surface of the piezoelectric substrate, wherein the IDT electrode includes a close contact layer located on the electrode formation surface of the piezoelectric substrate, an intermediate layer located on the close contact layer, and a main electrode layer located on the intermediate layer, wherein each of the close contact layer and the intermediate layer includes a lateral surface, wherein at least a portion of the lateral surface of the close contact layer is inclined relative to a normal direction of the electrode formation surface, and an area of a surface of the close contact layer that is in close contact with the intermediate layer is smaller than an area of a surface of the close contact layer that is in close contact with the piezoelectric substrate, and at least a portion of the lateral surface of the intermediate layer is inclined relative to the normal direction of the electrode formation surface, and an area of a surface of the intermediate layer that is in close contact with the main electrode layer is smaller than an area of a surface of the intermediate layer that is in close contact with the close contact layer, and an angle defined by the inclined portion of the lateral surface of the close contact layer and an angle defined by the inclined portion of the lateral surface of the intermediate layer with respect to the normal direction of the electrode formation surface are an inclination angle of the lateral surface of the close contact layer and an inclination angle of the lateral surface of the intermediate layer, respectively, and the inclination angle of the lateral surface of the intermediate layer is smaller than the inclination angle of the lateral surface of the close contact layer. As a result, the distortion of the main electrode layer due to the excitation of the acoustic wave is able to be further significantly reduced or prevented.

According to a preferred embodiment of the present invention, in the above acoustic wave device, the main electrode layer includes a lateral surface, an angle defined by the lateral surface of the main electrode layer with respect to the normal direction of the electrode formation surface is an inclination angle of the lateral surface of the main electrode layer, and the inclination angle of the lateral surface of the main electrode layer is equal to or smaller than the inclination angle of the lateral surface of the intermediate layer. Consequently, the distortion of the main electrode layer due to the excitation of the acoustic wave is able to be further significantly reduced or prevented.

According to a preferred embodiment of the present invention, in the above acoustic wave device, an elastic modulus of a metal of the close contact layer is equal to or larger than an elastic modulus of a metal of the intermediate layer, and the elastic modulus of the metal of the intermediate layer is larger than an elastic modulus of a metal of the main electrode layer. As a result, the distortion of the main electrode layer due to the excitation of the acoustic wave is able to be significantly reduced or prevented.

According to a preferred embodiment of the present invention, in the above acoustic wave device, a melting point of a metal of the close contact layer is equal to or higher than a melting point of a metal of the intermediate layer, and the melting point of the metal of the intermediate layer is equal to or higher than a melting point of a metal of the main electrode layer. Thus, the distortion of the main electrode layer due to the excitation of the acoustic wave is able to be significantly reduced or prevented more reliably.

According to a preferred embodiment of the present invention, in the above acoustic wave device, the close contact layer includes one of NiCr and Ti, the intermediate layer includes Ti, and the main electrode layer includes Al. Therefore, the distortion of the main electrode layer due to the excitation of the acoustic wave is able to be further significantly reduced or prevented.

In addition, according to a preferred embodiment of the present invention, a manufacturing method of an acoustic wave device in which an IDT electrode including a close contact layer and a main electrode layer is provided on a piezoelectric substrate, includes steps of preparing the piezoelectric substrate including an electrode formation surface, and forming the IDT electrode on the electrode formation surface of the piezoelectric substrate, the step of forming the IDT electrode including steps of laminating a resist layer on the electrode formation surface of the piezoelectric substrate, patterning the resist layer, laminating a metal film of the close contact layer on both the piezoelectric substrate and the resist layer by a vapor deposition process, laminating a metal film of the main electrode layer on the metal film of the close contact layer by a vapor deposition process, and peeling off the resist layer from the piezoelectric substrate, wherein the close contact layer includes a first layer in close contact with the piezoelectric substrate, and a second layer in close contact with the main electrode layer, the first layer including a first lateral surface, the second layer including a second lateral surface, and in the step of laminating the metal film of the close contact layer on both the piezoelectric substrate and the resist layer, the metal film of the close contact layer is laminated, while conditions of the vapor deposition process are changed, to define the first and second lateral surfaces in a state inclined relative to a normal direction of the electrode formation surface and to form an area of a surface of the second layer that is in close contact with the main electrode layer, smaller than an area of a surface of the first layer that is in close contact with the piezoelectric substrate, such that angles defined by the first and second lateral surfaces with respect to the normal direction of the electrode formation surface are inclination angles of each of the first and second lateral surfaces, and the inclination angle of the second lateral surface is smaller than the inclination angle of the first lateral surface. Thus, the distortion of the main electrode layer due to the excitation of the acoustic wave is able to be further significantly reduced or prevented.

According to a preferred embodiment of the present invention, in the step of laminating the metal film of the close contact layer on both the piezoelectric substrate and the resist layer in the above manufacturing method of the acoustic wave device, a film formation speed in the vapor deposition process when the second layer is formed is set to be slower than a film formation speed in the vapor deposition process when the first layer is formed. Accordingly, the distortion of the main electrode layer due to the excitation of the acoustic wave is able to be significantly reduced or prevented more reliably.

According to the preferred embodiments of the present invention, acoustic wave devices and methods of manufacturing thereof are provided in which the distortion of the IDT electrode due to the excitation of the acoustic wave is able to be significantly reduced or prevented, and in which the IMD characteristics are able to be significantly improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by reading the following description of preferred embodiments of the present invention with reference to the drawings.

It is to be noted that the preferred embodiments disclosed in this description are merely illustrative, and that partial replacement or combination of individual elements is optionally feasible between the different preferred embodiments.

Figure 1:
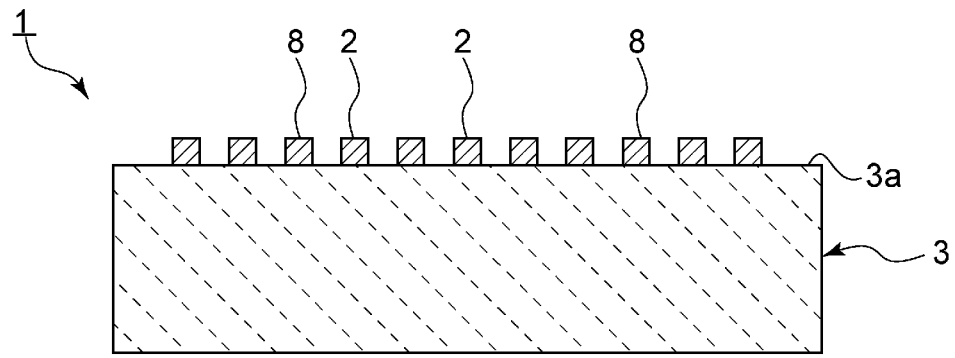
FIG. 1 is a front sectional view of an acoustic wave device according to a first preferred embodiment of the present invention.

FIG. 1 is a front sectional view of an acoustic wave device according to a first preferred embodiment of the present invention.

The acoustic wave device 1 includes a piezoelectric substrate 3. The piezoelectric substrate 3 includes $LiTaO_3$. It is to be noted that materials of the piezoelectric substrate are not limited to particular ones, and that the piezoelectric substrate may include appropriate one of piezoelectric single crystals or piezoelectric ceramics. More specifically, the piezoelectric substrate may include, for example, $LiNbO_3$, $KNbO_3$, quartz, langasite, ZnO, PZT (piezoelectric zirconate titanate), or lithium tetraborate.

The piezoelectric substrate 3 includes an electrode formation surface 3a. An IDT electrode 2 is defined on the electrode formation surface 3a. An acoustic wave is excited when an AC voltage is applied to the IDT electrode 2. In this preferred embodiment, reflectors 8 are located at both sides of the IDT electrode 2 in a propagation direction of the acoustic wave. With such an arrangement, an acoustic wave resonator with one port is provided. The reflectors are not always required to be included.

Figure 2A:
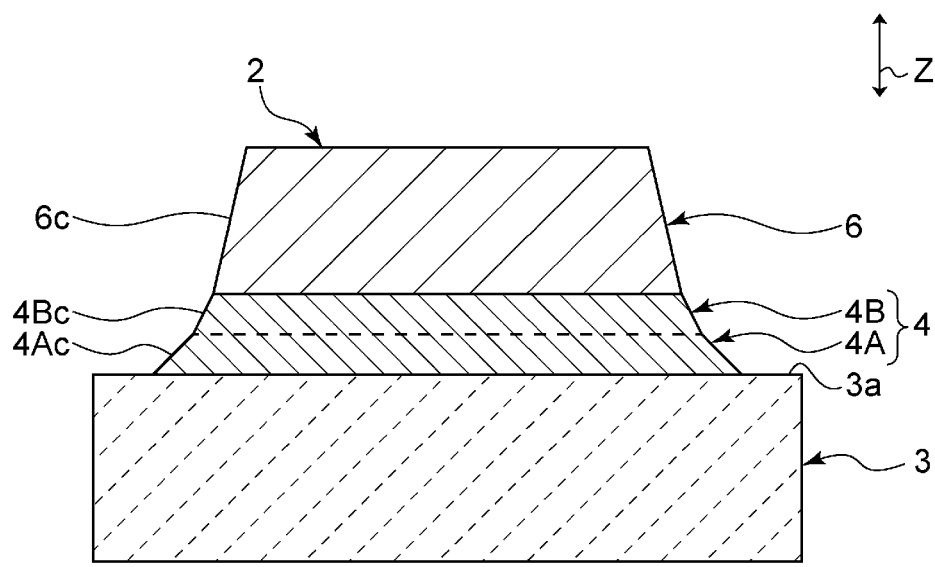
FIG. 2A is an enlarged front sectional view of an IDT electrode according to the first preferred embodiment of the present invention.
Figure 2B:
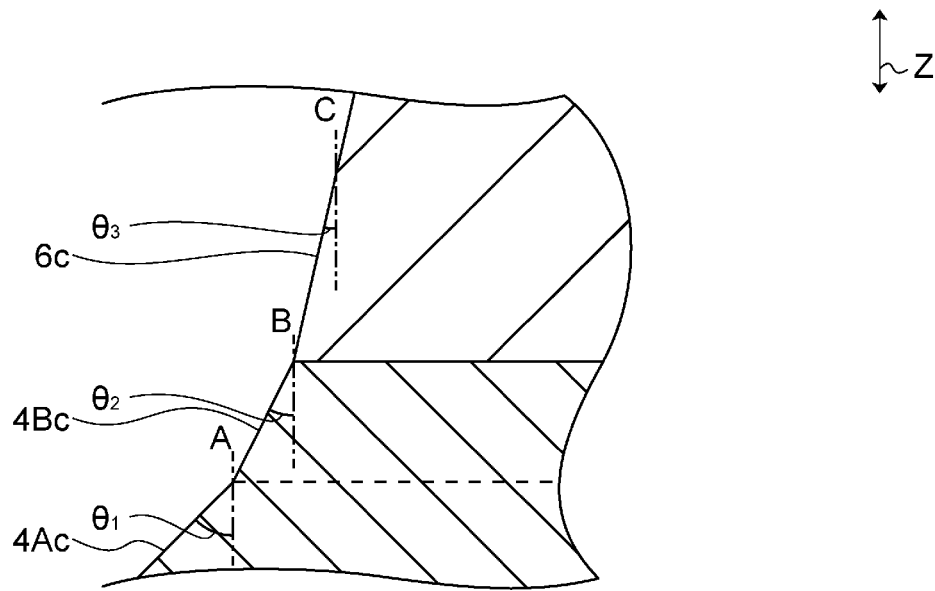
FIG. 2B is an enlarged front sectional view, partly cut and taken out, of the IDT electrode according to the first preferred embodiment of the present invention.

FIG. 2A is an enlarged front sectional view of an IDT electrode according to the first preferred embodiment. FIG. 2B is an enlarged front sectional view, partly cut and taken out, of the IDT electrode according to the first preferred embodiment. More specifically, each of FIGS. 2A and 2B illustrates, in an enlarged scale, one among a plurality of electrode fingers of the IDT electrode. This is similarly applied to FIG. 3, FIGS. 6A to 6C, FIGS. 7A and 7B, and FIG. 8, which are described below.

As illustrated in FIG. 2A, the IDT electrode 2 includes a close contact layer 4 provided on the electrode formation surface 3a of the piezoelectric substrate 3. A main electrode layer 6 is located on the close contact layer 4. The close contact layer 4 provides higher adhesion to the piezoelectric substrate 3 than that of the main electrode layer 6 to the piezoelectric substrate 3. The close contact layer 4 includes a first layer 4A in close contact with the piezoelectric substrate 3. The close contact layer 4 further includes a second layer 4B in close contact with the main electrode layer 6. The first layer 4A and the second layer 4B are continuously provided in a normal direction Z of the electrode formation surface 3a.

In this preferred embodiment, the close contact layer 4 includes Ti. Although materials of the close contact layer are not limited to particular ones, the close contact layer preferably includes an appropriate metal that provides high adhesion to the piezoelectric substrate. More specifically, the close contact layer preferably includes, for example, Ti, Cr, NiCr, Zr, Ta, W, or Mo.

In this description, the main electrode layer 6 defines and functions as a dominant electrode layer in excitation of the acoustic wave. The main electrode layer 6 in this preferred embodiment includes Al. The main electrode layer preferably includes an appropriate metal with a low resistance. More specifically, the main electrode layer preferably includes, for example, Al, Cu, Au, or Ag. Resistance to stress migration may be increased by adding another element to the metal that defines the main electrode layer. For example, an alloy containing Al as a main ingredient and being added with Cu is preferably included as a material of the main electrode layer.

In this preferred embodiment, the close contact layer 4 preferably includes a thickness of about 30 nm, and the main electrode layer 6 includes a thickness of about 430 nm, for example. A wavelength specified by a distance between the electrode fingers of the IDT electrode 2 preferably is about 4.6 μm, for example. The IDT electrode 2 preferably has a duty of about 0.5, for example. The thicknesses of the individual layers of the IDT electrode, and the wavelength and the duty of the IDT electrode are not limited to particular ones.

The first layer 4A of the close contact layer 4 includes a first lateral surface 4Ac. The second layer 4B includes a second lateral surface 4Bc. The first and second lateral surfaces 4Ac and 4Bc are each inclined relative to the normal direction Z of the electrode formation surface 3a. More specifically, the first and second lateral surfaces 4Ac and 4Bc are inclined, and an area of a surface of the second layer 4B that is in close contact with the main electrode layer 6, is smaller than an area of a surface of the first layer 4A that is in close contact with the piezoelectric substrate 3. Preferably, at least portions of each of the first and second lateral surfaces are each inclined relative to the normal direction Z of the electrode formation surface 3a. In addition, the main electrode layer 6 includes a lateral surface 6c.

Here, angles defined by the first and second lateral surfaces 4Ac and 4Bc with respect to the normal direction Z of the electrode formation surface 3a are defined as inclination angles of each of the first and second lateral surfaces 4Ac and 4Bc, respectively. More specifically, as illustrated in FIG. 2B, an angle defined between a one-dot-chain line A extending in the normal direction Z of the electrode formation surface and the first lateral surface 4Ac is an inclination angle $\theta_1$ of the first lateral surface 4Ac. Similarly, an angle defined between a one-dot-chain line B and the second lateral surface 4Bc is an inclination angle $\theta_2$ of the second lateral surface 4Bc. In the case where portions of each of the first and second lateral surfaces are inclined relative to the normal direction of the electrode formation surface, angles defined by the inclined portions of each of the first and second lateral surfaces with respect to the normal direction of the electrode formation surface are the inclination angles of each of the first and second lateral surfaces, respectively.

The present preferred embodiment is featured in that the inclination angle $\theta_2$ of the second lateral surface 4Bc is smaller than the inclination angle $\theta_1$ of the first lateral surface 4Ac. In other words, metals are laminated and a width of the electrode finger is gradually narrowed in a direction away from the electrode formation surface 3a, illustrated in FIG. 2A, along a lamination direction of the IDT electrode 2. With the above feature, a distortion of the main electrode layer 6 in the IDT electrode 2, due to the excitation of the acoustic wave, is able to be significantly reduced or prevented, and IMD characteristics are able to be significantly improved. That point will be described below in comparison with a comparative example.

Figure 3:
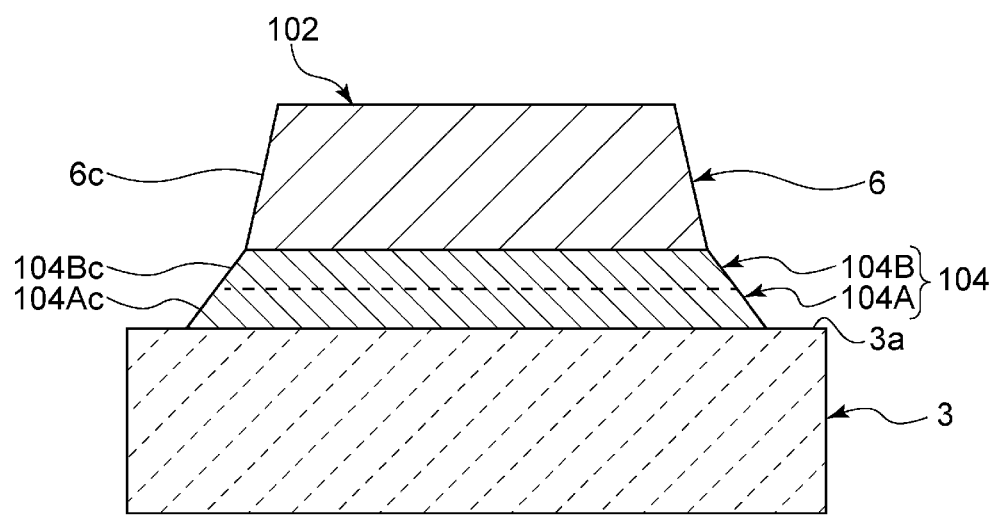
FIG. 3 is an enlarged front sectional view of an IDT electrode of a comparative example.

FIG. 3 is an enlarged front sectional view of an IDT electrode of the comparative example.

A close contact layer 104 of an IDT electrode 102 in an acoustic wave device of the comparative example includes first and second layers 104A and 104B. The first and second layers 104A and 104B include first and second lateral surfaces 104Ac and 104Bc, respectively. In the acoustic wave device of the comparative example, there is no difference between an inclination angle of the first lateral surface 104Ac and an inclination angle of the second lateral surface 104Bc. Except for the above point, the acoustic wave device of the comparative example includes a similar structure to that of the acoustic wave device 1 of the first preferred embodiment.

Figure 4A:
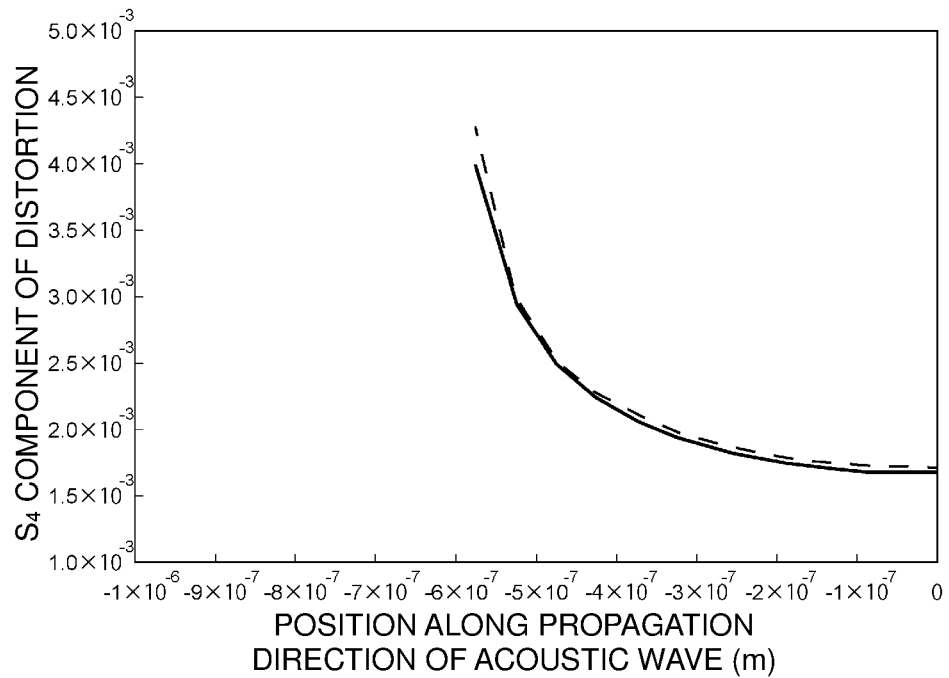
FIGS. 4A and 4B are graphs each showing relations between a position of an electrode finger of the IDT electrode along a propagation direction of an acoustic wave and an $S_4$ component of distortion in a surface of a main electrode layer on the side closer to a piezoelectric substrate according to the first preferred embodiment of the present invention and the comparative example.
Figure 4B:
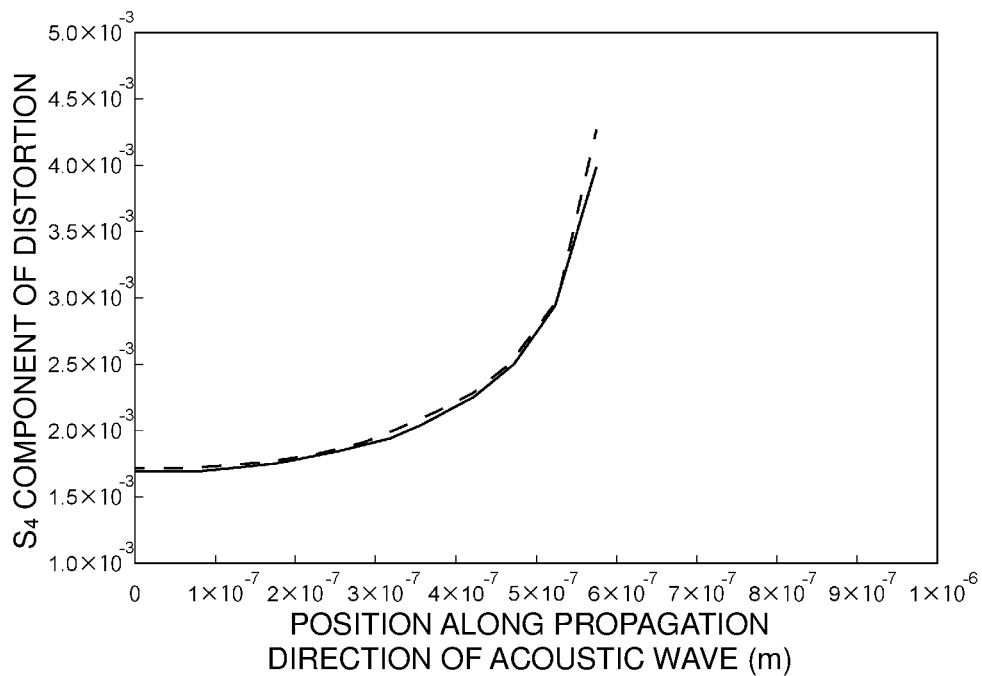

FIGS. 4A and 4B are graphs each showing relations between a position of the electrode finger of the IDT electrode along the propagation direction of the acoustic wave and an $S_4$ component of distortion in a surface of the main electrode layer on the side closer to the piezoelectric substrate according to the first preferred embodiment and the comparative example. A solid line represents the result provided with the first preferred embodiment, and a broken line represents the result provided with the comparative example. When a direction perpendicular or substantially perpendicular to an extending direction of the electrode finger is a widthwise direction of the electrode finger, a position where a value of a horizontal axis in each of FIGS. 4A and 4B is zero (0) corresponds to a center position of the electrode finger in the widthwise direction thereof. FIG. 4A shows the magnitude of the distortion in a region from the center of the electrode finger in the widthwise direction to one end surface thereof. FIG. 4B shows the magnitude of the distortion in a region from the center of the electrode finger in the widthwise direction to an end surface thereof on the opposite side to the end surface illustrated in FIG. 4A.

As described above, an acoustic wave is excited when a voltage is applied to the IDT electrode. At that time, stress acts on the surface of the IDT electrode on the side closer to the piezoelectric substrate. This causes a distortion in the main electrode layer. In this preferred embodiment and the comparative example, the magnitude of the distortion increases as the position described above comes closer to the end surface from the center of the electrode finger. Furthermore, as seen from FIGS. 4A and 4B, the distortion is able to be significantly reduced or prevented in this preferred embodiment in comparison with the comparative example.

As shown in FIG. 4A, the distortion at the one end surface of the electrode finger is $4.26 \times 10^{-3}$ in the comparative example, and is $3.99 \times 10^{-3}$ in the present preferred embodiment, for example. Thus, according to the present preferred embodiment, the $S_4$ component of the distortion is able to be reduced by about $0.27 \times 10^{-3}$, for example, in comparison with the comparative example. Moreover, it is seen that the distortion is able to be significantly reduced or prevented in this preferred embodiment in comparison with the comparative example in a region extending over about 10% of an entire length of the electrode finger in the widthwise direction from the end surface of the electrode finger, for example.

At the end surface of the electrode finger represented by FIG. 4B, the distortion is $4.26 \times 10^{-3}$ in the comparative example, and is $3.99 \times 10^{-3}$ in this preferred embodiment, for example. Thus, according to this preferred embodiment, the $S_4$ component of the distortion is able to be reduced by about $0.27 \times 10^{-3}$ in comparison with the comparative example at the end surface represented by FIG. 4B as well. Moreover, it is seen that, also in the widthwise direction, the distortion is able to be significantly reduced or prevented in this preferred embodiment in comparison with the comparative example in the region extending over about 10% of the entire length of the electrode finger in the widthwise direction from the end surface of the electrode finger represented by FIG. 4B. The reason why the distortion is able to be significantly reduced or prevented according to this preferred embodiment presumably resides in the following theory.

In this preferred embodiment, as illustrated in FIG. 2A, the inclination angle of the second lateral surface 4Bc the close contact layer 4 is smaller than that of the first lateral surface 4Ac thereof. Accordingly, the stress acting on the lateral surface of the electrode finger of the IDT electrode 2 and thereabout with the excitation of the acoustic wave is distributed toward the piezoelectric substrate 3 at a larger proportion than toward the main electrode layer 6. Thus, since concentration of the stress on the surface of the main electrode layer 6 on the side closer to the piezoelectric substrate 3 with the excitation of the acoustic wave is mitigated, the distortion of the main electrode layer 6 is significantly reduced or prevented.

Here, as illustrated in FIG. 2B, an angle defined between the lateral surface 6c of the main electrode layer 6 and a one-dot-chain line C extending in the normal direction Z of the electrode formation surface of the piezoelectric substrate 3 is an inclination angle $\theta_3$ of the lateral surface 6c of the main electrode layer 6. Accordingly, as in this preferred embodiment, the inclination angle $\theta_3$ of the lateral surface 6c of the main electrode layer 6 is preferably equal to or smaller than the inclination angle $\theta_2$ of the second lateral surface 4Bc. With such a feature, the distortion of the main electrode layer 6 is able to be further significantly reduced or prevented. The lateral surface of the main electrode layer may be inclined relative to the normal direction of the electrode formation surface and only a portion of the lateral surface is inclined, or that the entirety of the lateral surface is inclined. Alternatively, the lateral surface of the main electrode layer may not include a region inclined relative to the normal direction of the electrode formation surface. When the lateral surface of the main electrode layer is not inclined relative to the normal direction of the electrode formation surface, the inclination angle thereof is 0°.

A relation between the distortion and the IMD characteristics will be described below. The following represents a relation between the $S_4$ component of the distortion and a level of a third harmonic in the case of an SH (Shear Horizontal) wave. In an example described below, the third harmonic is an unwanted wave, and the IMD characteristics are significantly improved as the level of the third harmonic is lower.

Figure 5:
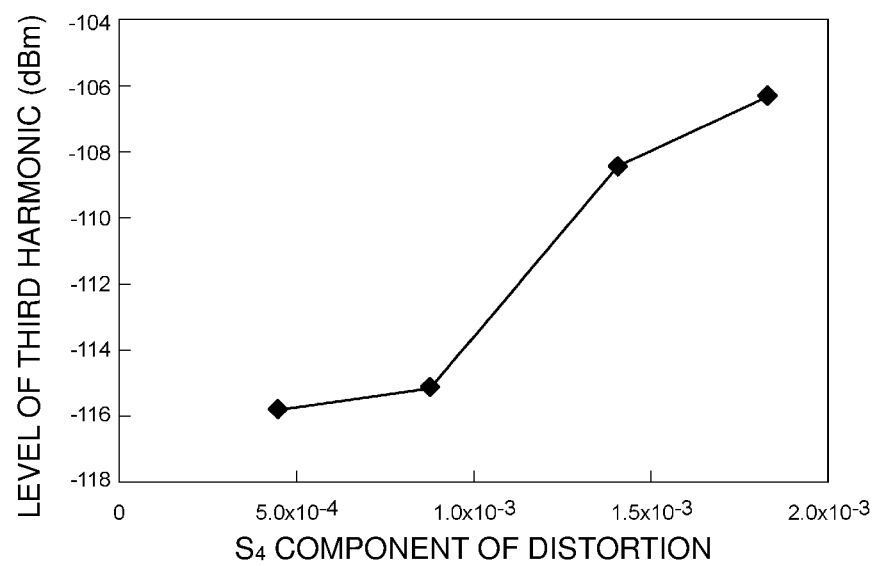
FIG. 5 is a graph showing a relation between the $S_4$ component of the distortion and a level of a third harmonic.

FIG. 5 is a graph showing the relation between the $S_4$ component of the distortion and the level of the third harmonic.

As seen from FIG. 5, the level of the third harmonic lowers as the $S_4$ component of the distortion reduces. It is hence understood that the IMD characteristics are able to be significantly improved by significantly reducing or preventing the distortion of the IDT electrode.

As illustrated in FIG. 2A, the close contact layer 4 is positioned on the side closer to the piezoelectric substrate 3 than the main electrode layer 6. In addition, as described above, the stress acting on the lateral surface of the electrode finger of the IDT electrode 2 and thereabout is distributed toward the piezoelectric substrate 3 at a larger proportion than toward the main electrode layer 6. In this preferred embodiment, the close contact layer 4 of the IDT electrode 2 includes Ti, and the main electrode layer 6 thereof includes Al. Thus, an elastic modulus of the metal of the close contact layer 4 is preferably larger than that of the metal of the main electrode layer 6. This makes it possible to significantly reduce or prevent stress acting on the main electrode layer 6 from the side including the piezoelectric substrate 3 with the excitation of the acoustic wave. As a result, the distortion of the main electrode layer 6 is able to be significantly reduced or prevented.

A manufacturing method of the acoustic wave device 1 will be described below.

Figure 6A:
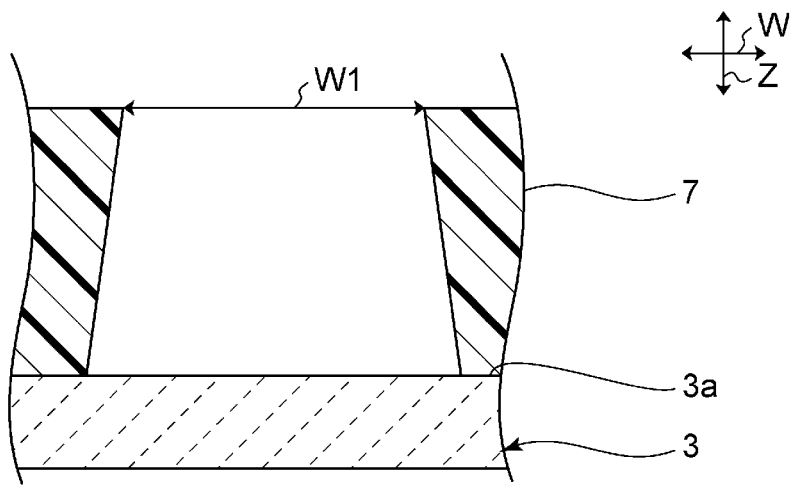
FIGS. 6A to 6C are front sectional views, partly cut and taken out, of the IDT electrode, which are referenced to explain a manufacturing method of the acoustic wave device according to the first preferred embodiment of the present invention.
Figure 6B:
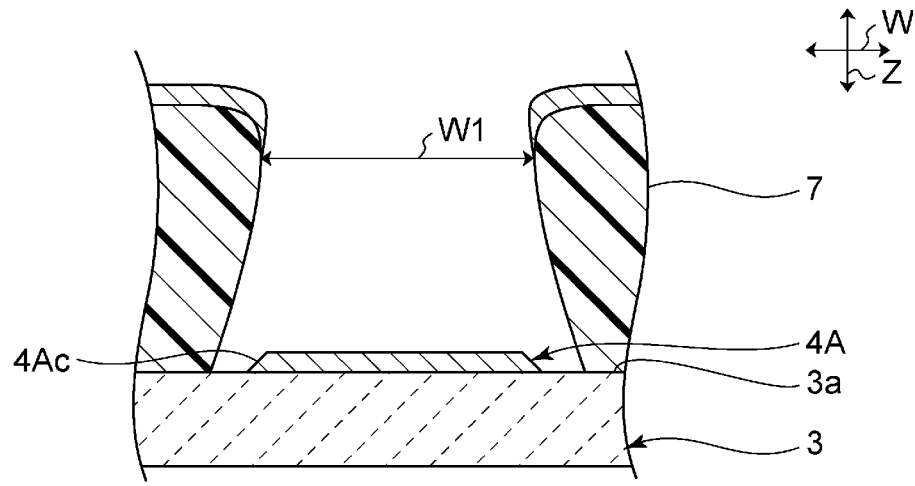
Figure 6C:
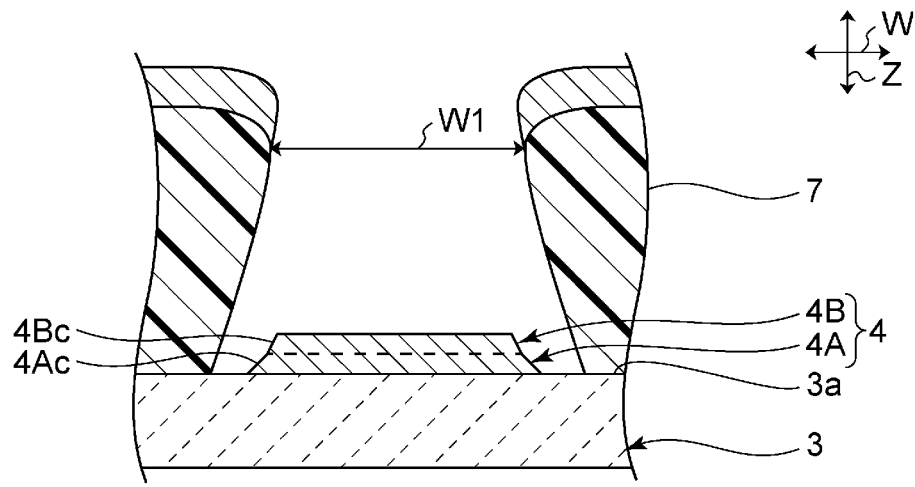
Figure 7A:
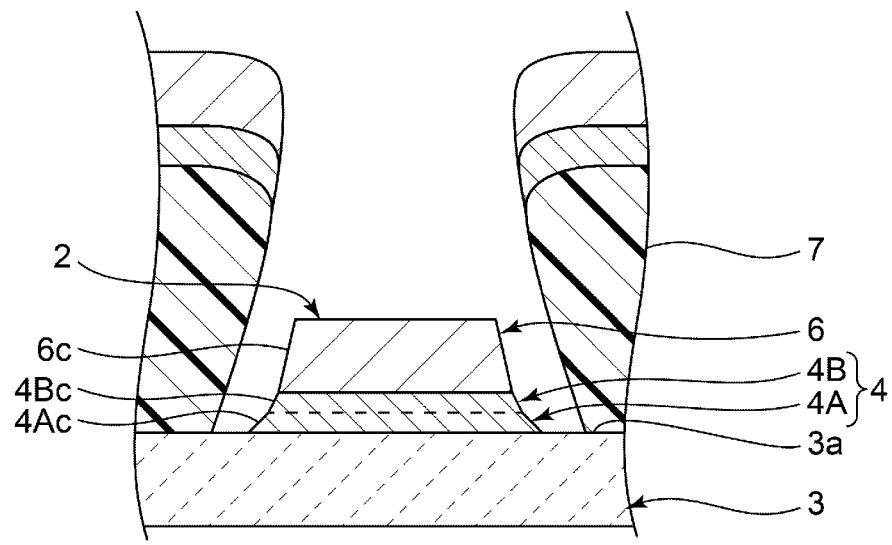
FIGS. 7A and 7B are front sectional views, partly cut and taken out, of the IDT electrode, which are referenced to explain the manufacturing method of the acoustic wave device according to the first preferred embodiment of the present invention.
Figure 7B:
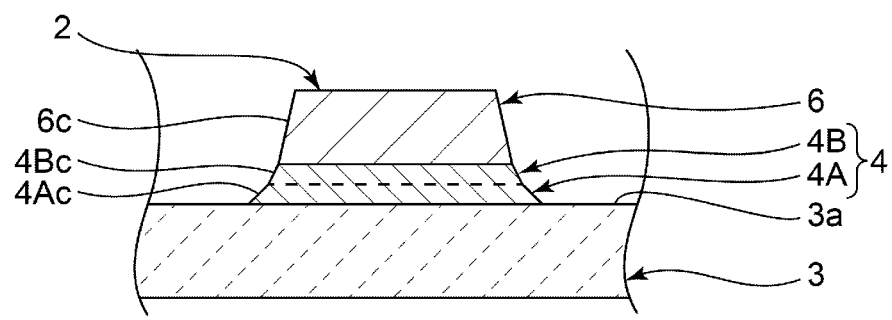

FIGS. 6A to 6C are front sectional views, partly cut and taken out, of the IDT electrode, which are referenced to explain the manufacturing method of the acoustic wave device according to the first preferred embodiment. FIGS. 7A and 7B are front sectional views, partly cut and taken out, of the IDT electrode, which are referenced to explain the manufacturing method of the acoustic wave device according to the first preferred embodiment. It is to be noted that FIGS. 7A and 7B represent steps executed subsequent to steps illustrated in FIGS. 6A to 6C.

As illustrated in FIG. 6A, the piezoelectric substrate is prepared. Then, a resist layer 7 is laminated on the piezoelectric substrate 3. Then, the resist layer 7 is subjected to patterning. With the patterning, openings are defined in partial regions of the resist layer 7, and the piezoelectric substrate 3 is exposed in the opened regions. The photolithography technique with a negative photoresist, for example, is able to be applied in the step of forming the patterned resist layer 7 on the piezoelectric substrate 3.

Then, as illustrated in FIGS. 6B and 6C, metal films of the close contact layer 4 are laminated on both the piezoelectric substrate 3 and the resist layer 7 by a vapor deposition process. The close contact layer 4 is provided with the metal films laminated on the piezoelectric substrate 3 in each of the opened regions of the resist layer 7.

On that occasion, when a metal film with a high melting point is laminated on the resist layer 7 by the vapor deposition process, the resist layer 7 is deformed due to radiant heat from the metal film. Here, a direction intersecting the opened region of the resist layer 7 is defined a widthwise direction W. With the deformation of the resist layer 7 as described above, a minimum width W1 of the opened region of the resist layer 7 is significantly reduced. As the width W1 reduces, a width of the opened region where the piezoelectric substrate 3 is exposed when viewed from the normal direction Z of the electrode formation surface 3a of the piezoelectric substrate 3 also reduces. Thus, since the deformation of the resist layer 7 is progressed during the step of forming the close contact layer 4, the first and second lateral surfaces 4Ac and 4Bc of the close contact layer 4 are each inclined.

In the manufacturing of the acoustic wave device 1 according to this preferred embodiment, a film formation speed in the step of forming the first layer 4A illustrated in FIG. 6B is set to be slower than that in the step of forming the second layer 4B illustrated in FIG. 6C. More specifically, by way of example, the film formation speed in the step of forming the first layer 4A preferably is set to about 5 Å/s, and the film formation speed in the step of forming the second layer 4B is set to about 0.5 Å/s. Heat conduction from the metal film vapor-deposited on the resist layer 7 and radiant heat from a vapor deposition source are significantly reduced or prevented to a lower level as the film formation speed becomes lower. Therefore, a temperature increase of the resist layer 7 is also significantly reduced or prevented. The resist layer 7 deforms at a higher speed at a higher temperature. Thus, in this preferred embodiment, a deformation speed of the resist layer 7 in the step of forming the second layer 4B is able to be slower than that of the resist layer 7 in the step of forming the first layer 4A. As a result, the inclination angle of the second lateral surface 4Bc of the second layer 4B is able to be smaller than that of the first lateral surface 4Ac of the first layer 4A.

Alternatively, a distance through which metal particles move after coming into contact with the piezoelectric substrate may be controlled by setting conditions of the vapor deposition process in the step of forming the first layer to be different from those of the vapor deposition process in the step of forming the second layer. With such control, the inclination angle of the second lateral surface of the second layer is able to be smaller than that of the first lateral surface of the first layer.

Returning to the description of the manufacturing method of the acoustic wave device 1 according to this preferred embodiment, as illustrated in FIG. 7A, a metal of the main electrode layer 6 is then laminated on the close contact layer 4 by a vapor deposition process. In this preferred embodiment, the close contact layer 4 includes Ti, and the main electrode layer 6 includes Al. Thus, a melting point of the metal of the main electrode layer 6 is preferably equal to or lower than that of the metal of the close contact layer 4. With such a feature, the temperature to which the resist layer 7 is heated in the step of forming the main electrode layer 6 is able to be equal to or lower than the temperature to which the resist layer 7 is heated in the step of forming the close contact layer 4. Accordingly, the inclination angle of the lateral surface 6c of the main electrode layer 6 is able to be more reliably equal to or smaller than that of the second lateral surface 4Bc of the close contact layer 4. Hence, the distortion of the main electrode layer 6 due to the excitation of the acoustic wave is able to be significantly reduced or prevented more reliably.

Then, as illustrated in FIG. 7B, the resist layer 7 illustrated in FIG. 7A is peeled off from the piezoelectric substrate 3.

Figure 8:
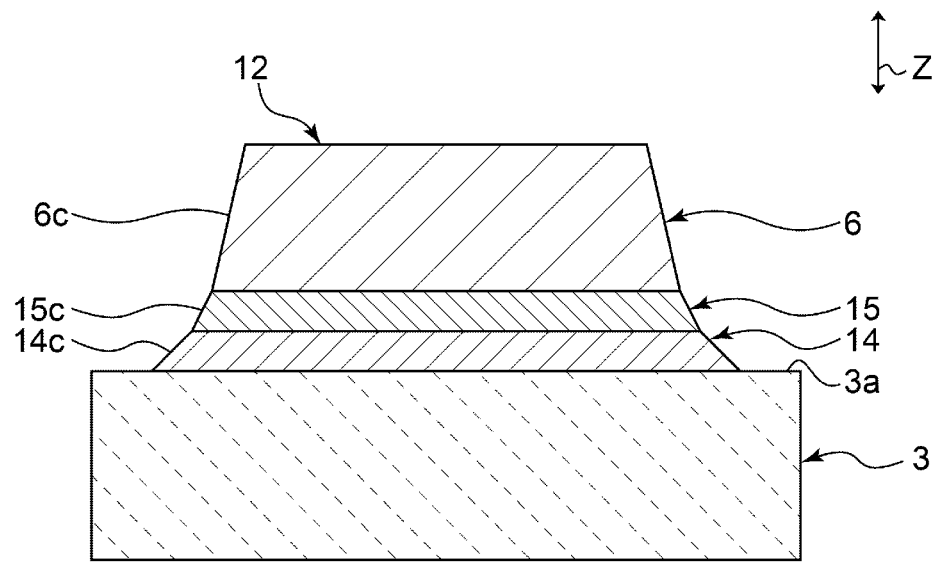
FIG. 8 is a front sectional view of an IDT electrode according to a second preferred embodiment of the present invention.

FIG. 8 is a front sectional view, partly cut and taken out, of an IDT electrode according to a second preferred embodiment of the present invention.

An acoustic wave device according to the second preferred embodiment is different from the proton-conducting electrolyte membrane according to the first preferred embodiment in that an IDT electrode 12 includes an intermediate layer 15 located between a close contact layer 14 and the main electrode layer 6. Furthermore, the close contact layer 14 includes a structure different from that of the close contact layer 4 according to the first preferred embodiment. Except for the points described above, the acoustic wave device according to the second preferred embodiment includes a structure similar to that of the acoustic wave device 1 according to the first preferred embodiment.

The close contact layer 14 provides higher adhesion to the piezoelectric substrate 3 than that of the intermediate layer 15 to the piezoelectric substrate 3. The close contact layer 14 includes a lateral surface 14c. An inclination angle of the lateral surface 14c of the close contact layer 14 is constant or substantially constant unlike the first preferred embodiment. According to the second preferred embodiment, the close contact layer 14 includes one of NiCr and Ti. Although a metal of the close contact layer is not limited to particular one, the close contact layer preferably includes an appropriate metal exhibiting good adhesion to the piezoelectric substrate as in the first preferred embodiment.

In this preferred embodiment, the intermediate layer 15 includes Ti. A metal of the intermediate layer is not limited to particular one. The close contact layer and the intermediate layer may include a same or similar metal.

The intermediate layer 15 includes a lateral surface 15c. An angle defined between the lateral surface 15c and the normal direction Z of the electrode formation surface 3a of the piezoelectric substrate 3 is an inclination angle of the lateral surface 15c. Accordingly, the inclination angle of the lateral surface 15c of the intermediate layer 15 is smaller than that of the lateral surface 14c of the close contact layer 14. As in the first preferred embodiment, therefore, the distortion of the main electrode layer 6 due to the excitation of the acoustic wave is able to be reduced. As a result, the IMD characteristics are able to be significantly improved.

Preferably, at least a portion of the lateral surface of the close contact layer is inclined relative to the normal direction of the electrode formation surface. Regarding the intermediate layer, preferably, at least a portion of the lateral surface of the intermediate layer is inclined relative to the normal direction of the electrode formation surface. When a portion of the lateral surface of the close contact layer is inclined relative to the normal direction of the electrode formation surface, an angle defined between the inclined portion of the lateral surface of the close contact layer and the normal direction described above is the inclination angle of the lateral surface of the close contact layer. When a portion of the lateral surface of the intermediate layer is inclined relative to the normal direction of the electrode formation surface, an angle defined between the inclined portion of the lateral surface of the intermediate layer and the normal line described above is the inclination angle of the lateral surface of the intermediate layer.

Moreover, the inclination angle of the lateral surface 6c of the main electrode layer 6 is equal to or smaller than that of the lateral surface 15c of the intermediate layer 15. As a result, the distortion of the main electrode layer 6 due to the excitation of the acoustic wave is able to be significantly reduced or prevented.

A melting point of the metal of the close contact layer 14 is equal to or higher than that of the metal of the intermediate layer 15. Accordingly, the inclination angle of the lateral surface 15c of the intermediate layer 15 is able to be smaller than that of the lateral surface 14c of the close contact layer 14 by applying a method similar to the manufacturing method described above. The melting point of the metal of the intermediate layer is equal to or higher than that of the metal of the main electrode layer 6. Accordingly, the inclination angle of the lateral surface 6c of the main electrode layer 6 is able to be equal to or smaller than that of the lateral surface 15c of the intermediate layer 15.

An elastic modulus of the metal of the close contact layer 14 is larger than that of the metal of the intermediate layer 15. The elastic modulus of the metal of the intermediate layer 15 is larger than that of the metal of the main electrode layer 6. Accordingly, the distortion of the main electrode layer 6 due to the excitation of the acoustic wave is able to be further significantly reduced or prevented as in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate including an electrode formation surface; and
an IDT electrode provided on the electrode formation surface of the piezoelectric substrate; wherein
the IDT electrode includes a close contact layer located on the electrode formation surface of the piezoelectric substrate, and a main electrode layer located on the close contact layer;
the close contact layer includes a first layer in close contact with the piezoelectric substrate, and a second layer in close contact with the main electrode layer;
the first layer includes a first lateral surface, and the second layer includes a second lateral surface;
at least portions of each of the first and second lateral surfaces are inclined relative to a normal direction of the electrode formation surface, and an area of a surface of the second layer that is in close contact with the main electrode layer is smaller than an area of a surface of the first layer that is in close contact with the piezoelectric substrate; and
angles defined by the inclined portions of each of the first and second lateral surfaces with respect to the normal direction of the electrode formation surface are inclination angles of each of the first and second lateral surfaces, and the inclination angle of the second lateral surface is smaller than the inclination angle of the first lateral surface.

2. The acoustic wave device according to claim 1, wherein the main electrode layer includes a lateral surface, an angle defined by the lateral surface of the main electrode layer with respect to the normal direction of the electrode formation surface of the piezoelectric substrate is an inclination angle of the lateral surface of the main electrode layer, and the inclination angle of the lateral surface of the main electrode layer is equal to or smaller than the inclination angle of the second lateral surface.

3. The acoustic wave device according to claim 1, wherein an elastic modulus of a metal of the close contact layer is larger than an elastic modulus of a metal of the main electrode layer.

4. The acoustic wave device according to claim 1, wherein a melting point of a metal of the close contact layer is equal to or higher than a melting point of a metal of the main electrode layer.

5. The acoustic wave device according to claim 1, wherein the close contact layer includes Ti, and the main electrode layer includes Al.

6. The acoustic wave device according to claim 1, wherein the acoustic wave device has a structure such that an acoustic wave is excited in response to an alternating current voltage being applied to the IDT electrode.

7. The acoustic wave device according to claim 6, wherein
at least one reflector is provided on the electrode formation surface of the piezoelectric substrate; and
the at least one reflector is located at a side of the IDT electrode in a propagation direction of the acoustic wave.

8. The acoustic wave device according to claim 1, wherein a thickness of the main electrode layer is greater than a thickness of the close contact layer.

9. The acoustic wave device according to claim 1, wherein the main electrode layer includes an alloy of Al and Cu.

10. The acoustic wave device according to claim 1, wherein:
the IDT electrode includes a plurality of electrode fingers; and
a width of each of the plurality of electrode fingers is narrowed in a direction away from the electrode formation surface, along a lamination direction of the IDT electrode.

11. An acoustic wave device comprising:
a piezoelectric substrate including an electrode formation surface; and
an IDT electrode provided on the electrode formation surface of the piezoelectric substrate; wherein
the IDT electrode includes a close contact layer located on the electrode formation surface of the piezoelectric substrate, an intermediate layer located on the close contact layer, and a main electrode layer located on the intermediate layer;
each of the close contact layer and the intermediate layer includes a lateral surface;
at least a portion of the lateral surface of the close contact layer is inclined relative to a normal direction of the electrode formation surface, and an area of a surface of the close contact layer that is in close contact with the intermediate layer is smaller than an area of a surface of the close contact layer that is in close contact with the piezoelectric substrate, and at least a portion of the lateral surface of the intermediate layer is inclined relative to the normal direction of the electrode formation surface, and an area of a surface of the intermediate layer that is in close contact with the main electrode layer is smaller than an area of a surface of the intermediate layer that is in close contact with the close contact layer; and
an angle defined by the inclined portion of the lateral surface of the close contact layer and an angle defined by the inclined portion of the lateral surface of the intermediate layer with respect to the normal direction of the electrode formation surface are an inclination angle of the lateral surface of the close contact layer and an inclination angle of the lateral surface of the intermediate layer, respectively, and the inclination angle of the lateral surface of the intermediate layer is smaller than the inclination angle of the lateral surface of the close contact layer.

12. The acoustic wave device according to claim 11, wherein the main electrode layer includes a lateral surface, an angle defined by the lateral surface of the main electrode layer with respect to the normal direction of the electrode formation surface is an inclination angle of the lateral surface of the main electrode layer, and the inclination angle of the lateral surface of the main electrode layer is equal to or smaller than the inclination angle of the lateral surface of the intermediate layer.

13. The acoustic wave device according to claim 11, wherein an elastic modulus of a metal of the close contact layer is equal to or larger than an elastic modulus of a metal of the intermediate layer, and the elastic modulus of the metal of the intermediate layer is larger than an elastic modulus of a metal of the main electrode layer.

14. The acoustic wave device according to claim 11, wherein a melting point of a metal of the close contact layer is equal to or higher than a melting point of a metal of the intermediate layer, and the melting point of the metal of the intermediate layer is equal to or higher than a melting point of a metal of the main electrode layer.

15. The acoustic wave device according to claim 11, wherein the close contact layer includes one of NiCr and Ti, the intermediate layer includes Ti, and the main electrode layer includes Al.

* * * * *